US009941857B1

(12) United States Patent
Olsson et al.

(10) Patent No.: US 9,941,857 B1
(45) Date of Patent: Apr. 10, 2018

(54) ATTENUATION OF SPURIOUS RESPONSES IN ELECTROMECHANICAL FILTERS

(71) Applicant: Sandia Corporation, Albuquerque, NM (US)

(72) Inventors: Roy H. Olsson, Albuquerque, NM (US); Vincent M. Hietala, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 169 days.

(21) Appl. No.: 15/072,611

(22) Filed: Mar. 17, 2016

Related U.S. Application Data

(60) Provisional application No. 62/135,047, filed on Mar. 18, 2015.

(51) Int. Cl.
*H03H 9/02* (2006.01)
*H03H 9/54* (2006.01)
*H03H 9/46* (2006.01)
*H03H 9/64* (2006.01)

(52) U.S. Cl.
CPC ........ *H03H 9/02433* (2013.01); *H03H 9/462* (2013.01); *H03H 9/54* (2013.01); *H03H 9/64* (2013.01)

(58) Field of Classification Search
CPC .......... H03H 9/02086; H03H 9/02157; H03H 9/02818; H03H 9/02433; H03H 9/54; H03H 9/64; H03H 9/462
USPC .......................... 333/133, 186, 187, 193–196
See application file for complete search history.

(56) References Cited

U.S. PATENT DOCUMENTS

| 5,294,862 | A | * | 3/1994 | Banno | H03H 9/605 310/359 |
| 6,909,340 | B2 | * | 6/2005 | Aigner | H03H 9/02157 310/312 |
| 7,385,334 | B1 | | 6/2008 | Olsson et al. | |
| 8,081,049 | B2 | * | 12/2011 | Yoshida | H03H 3/04 29/25.35 |
| 8,253,513 | B2 | * | 8/2012 | Zhang | H04R 17/00 310/346 |
| 8,367,305 | B1 | | 2/2013 | Wojciechowski et al. | |

(Continued)

OTHER PUBLICATIONS

Lin, C-H et al., "Temperature-Compensated Aluminum Nitride Lamb Wave Resonators", IEEE Transactions on Ultrasonics, Ferroelectrics, and Frequency Control, 2010, p. 524, vol. 57.

(Continued)

*Primary Examiner* — Robert J Pascal
*Assistant Examiner* — Jorge Salazar, Jr.
(74) *Attorney, Agent, or Firm* — Martin I. Finston

(57) ABSTRACT

A spur cancelling, electromechanical filter includes a first resonator having a first resonant frequency and one or more first spurious responses, and it also includes, electrically connected to the first resonator, a second resonator having a second resonant frequency and one or more second spurious responses. The first and second resonant frequencies are approximately identical, but the first resonator is physically non-identical to the second resonator. The difference between the resonators makes the respective spurious responses different. This allows for filters constructed from a cascade of these resonators to exhibit reduced spurious responses.

17 Claims, 12 Drawing Sheets

(56) References Cited

U.S. PATENT DOCUMENTS 8,669,823 B1    3/2014    Olsson et al.

OTHER PUBLICATIONS

Gong, S. et al., "Design and Analsis of Lithium-Niobate-Based High Electromechanical Coupling RF-MEMS Resonators for Wideband Filtering", IEEE Transactions on Microwave Theory and Techniques, 2013, p. 403, vol. 61.

Ishii, O. et al., "High Frequency Quartz Resonators and Filters Operating at Fundamental Mode", Interntnl Symp. on Acoustic Wave Dev. for Future Mobile Comm. Syst., Mar. 5, 2001, Chiba Univ., Japan; URL: http://www.te.chiba-u.ip/~ken/Symp/Symp2001/PAPER/ISHII.PDF.

Nguyen, Janet, "Realization of Temperature Compensated Aluminum Nitride Microresonator Filters with Bandwiths Beyond Kt2 Limit" University of New Mexico Electrical EngineeringThesis, 2013.

Kim, B. et al., "AlN Microresonator-Based Filters with Multiple Bandwidths at Low Intermediate Frequencies" Journal of Microelectromechanical Systems, 2013, p. 949, vol. 22.

Olsson, R. H. et al., "Origins and Mitigation of Spurious Modes in Aluminum Nitride Microresonators", IEEE International Ultrasonics Symposium Proceedings, 2010, San Diego, CA, p. 1272.

Olsson, R. H. et al., "A Method for Attenuating the Spurious Responses of Aluminum Nitride Micromechanical Filters", Journal of Microelectromechanical Systems, 2014, p. 1198, vol. 23.

Olsson, R. H. et al., "A Programmable Bandwidth Aluminum Nitride Microresonator Filter", Proc. Govt. Microcircuit Appl. Critical Tech. Conf., Las Vegas, NV, 2013, pp. 277-280.

Olsson, R. H. et al., "VHF and UHF Mechanically Coupled Aluminum Nitride MEMS Filters", IEEE Int'l Frequency Contro Symposium, Honolulu, HI, May 2008, pp. 634-639.

Pourkamali, S. et al., "Electrically coupled MEMS bandpass filters Part I: With coupling element", Sensors and Actuators A Physical, 2005, pp. 307-316, vol. 122.

Rinaldi, M. et al., "AiN Countour-Mode Resonators for Narrow-Band Filters above 3 GHz", Proc IEEE Int. 22nd Eur. Freq. Time Forum Freq. Contrl. Symp., Besancon France, 2009, pp. 70-74.

Wojciechowski, K. E. et al., "Paralell Lattice Filters Utilizing Aluminum Nitride Contour Mode Resonators", Sandia National Laboratories, SAND2010-1342C, 2010, p. 65.

Zuo, C. et al., "Very high frequency channel-select MEMS filters based on self-coupled piezoelectric AlN contour-mode resonators", Sensors and Actuators A: Physical, 2010, vol. 160, pp. 132-140.

\* cited by examiner

ATTENUATION OF SPURIOUS RESPONSES IN ELECTROMECHANICAL FILTERS

CLAIM FOR BENEFIT OF PROVISIONAL APPLICATION

This application claims the benefit of the earlier filing date of U.S. Provisional Patent Application No. 62/135,047, filed Mar. 18, 2015, titled "A Method for Attenuating the Spurious Responses of Crystal Filters". The aforementioned application is hereby incorporated by reference, in its entirety, for all purposes.

STATEMENT OF GOVERNMENT INTEREST

This invention was made with Government support under contract no. DE-AC04-94AL85000 awarded by the U.S. Department of Energy to Sandia Corporation. The Government has certain rights in the invention.

FIELD OF THE INVENTION

The present invention relates to the field of electromechanical resonant devices such as radio-frequency filters, and more particularly to devices using microscale mechanical resonators.

BACKGROUND OF THE INVENTION

Electroacoustic resonators are of interest because, among other things, they can be used to perform signal processing and sensing functions. Electroacoustic resonators include surface acoustic wave (SAW) and bulk acoustic wave (BAW) resonators, as well as micromechanical resonators, or "microresonators".

For example, microresonators fabricated from aluminum nitride (AlN) are used in radiofrequency (RF) filters, accelerometers, and sensors. AlN is one example of a piezoelectric material that responds both electrically and mechanically to applied electric signals, and that can be formed into an electroacoustic resonator capable of modifying such signals.

For any electroacoustic resonator-based filter, signal degradation can arise from undesired spurious responses. For instance, an AlN microresonator can be designed to efficiently transduce to any of various desired modes, but transduction to the numerous undesired symmetric and anti-symmetric Lamb modes, as well as interactions of acoustic waves with various device components, can also give rise to spurious responses. Accordingly, additional resonator architectures and methods are needed to reduce and mitigate such spurious responses.

SUMMARY OF THE INVENTION

The present invention relates to improvements in resonant electromechanical devices to suppress spurious spectral features in the response functions of those devices. In various embodiments, two or more resonators are electrically connected together to form a filter having a bandwidth and a center frequency. The connected resonators have center frequencies that substantially coincide.

However, at least two of those resonators are physically different from each other in regard to a feature or features that affect the mode shape of the resonator at the resonance corresponding to its center frequency. As a consequence, the positions in frequency space of "spurs", i.e., of undesired, or spurious, resonant responses of the individual resonators are also affected. The placement of at least some spurious responses at frequencies that do not coincide from one such resonator to another causes those responses to be attenuated in the resultant filter output. Concurrently, the overlapping of the center frequencies causes the desired response to be reinforced.

In the present context, two center frequencies are "substantially coincident" if they differ from each other by no more than the filter bandwidth. Typically, the center frequencies will coincide to within 10% of their respective values, and they will often coincide to within 1% or even less.

In various embodiments of the invention, a resonator comprises one or more sub-resonators that, if there are more than one, are electrically connected together. In embodiments, the sub-resonators are of the kind that have interdigitated electrode fingers. To provide resonators that are physically different in one example, a first resonator comprises one or more sub-resonators, each having an integer number $n_1$ of electrode fingers. A second resonator also comprises one or more sub-resonators, each of which has a different integer number $n_2$ of electrode fingers. Such an arrangement will often provide enough design freedom to create overlapping center frequencies, while offsetting many spurious resonances so that they do not overlap.

In embodiments, each sub-resonator is a microresonator.

In embodiments, a multiplicity of sub-resonators each having $n_1$ electrode fingers is electrically connected to a multiplicity of sub-resonators each having $n_2$ electrode fingers. The number of sub-resonators constituting one resonator need not be the same as the number constituting another resonator. For example, a specific embodiment to be described in detail below has three sub-resonators for which $n_1$ equals four, and it has four sub-resonators for which $n_2$ equals three. The first group of sub-resonators are connected in parallel, and the second group of sub-resonators are likewise connected in parallel. The two parallel-connected groups are connected together in series to make a cascaded, two-pole filter. Each of the two groups constitutes one pole of the filter. Of course additional poles can be added in like manner.

In embodiments of the kind described above, it is often advantageous to match the impedances of the series-connected filter poles. One way to match impedances is to require that the total number of electrode fingers must be equal, or about equal, on both sides of the connection. Thus if there are $m_1$ parallel-connected resonators in the first group and $m_2$ parallel-connected resonators in the second group, the requirement would be for $m_1 \times n_1$ to be equal or about equal to $m_2 \times n_2$.

Because the capacitance of the resonator is proportional to the total finger area, another way to match impedances that may be useful in some applications is to adjust the finger length in selected resonators.

In particular embodiments, each resonator or sub-resonator comprises a layer of piezoelectric material.

In particular embodiments, the piezoelectric material is aluminum nitride (AlN). In other embodiments, the piezoelectric material may be, for example, lithium niobate, lithium tantalate, or quartz.

In embodiments, the resonant electromechanical device is configured as a parallel lattice filter.

In embodiments, the resonant electromechanical device is configured as a ladder filter.

In embodiments, the resonators or sub-resonators are conformed as contour-mode resonators.

In embodiments, the resonant electromechanical device is configured as a multiple-pole micromechanical filter having a center frequency in the range 400 MHz to 600 MHz.

In embodiments, the resonant electromechanical device is configured as a multiple-pole micromechanical filter all of whose sub-resonators are microresonators that are 5-100 µm wide.

In embodiments, the resonant electromechanical device is configured as a multiple-pole micromechanical filter that has, over a bandwidth of 50 MHz to 2 GHz, a spurious response rejection greater than 50 dBc.

Definitions

As used herein, the term "about" means+/−10% of any recited value. As used herein, this term modifies any recited value, range of values, or endpoints of one or more ranges.

By "spurious mode" is meant a mode that is not predicted by a single-pole electrical equivalent circuit of the resonator, such as the model provided in FIG. 1. Such modes can include transmission (S21) parameters.

By "micro" is meant having at least one dimension that is less than 1 mm. For instance, a microstructure (e.g., any structure described herein) can have a length, width, height, cross-sectional dimension, circumference, radius (e.g., external or internal radius), or diameter that is less than 1 mm.

By "nano" is meant having at least one dimension that is less than 1 µm. For instance, a nanostructure (e.g., any structure described herein) can have a length, width, height, cross-sectional dimension, circumference, radius (e.g., external or internal radius), or diameter that is less than 1 µm.

By "mode" is meant a specific pattern of deformation of a plate or other body at a specific resonant frequency of the body.

By "overtone" is meant the mode number or doublet of mode numbers that characterize a particular mode of a vibrating body, including fundamental modes of vibration.

By "mode shape" is meant a description of a particular mode of a vibrating body. Two mode shapes are different if they differ by any one or more of the overtone, the symmetry (i.e. whether the deformation is symmetric or antisymmetric), and the type of principal mode of wave oscillation (i.e., as a longitudinal wave, shear wave, surface wave, or plate wave).

As used herein, the terms "top," "bottom," "upper," "lower," "above," and "below" are used to provide a relative relationship between structures. The use of these terms does not indicate or require that a particular structure must be located at a particular location in the apparatus.

DETAILED DESCRIPTION

Figure 1:
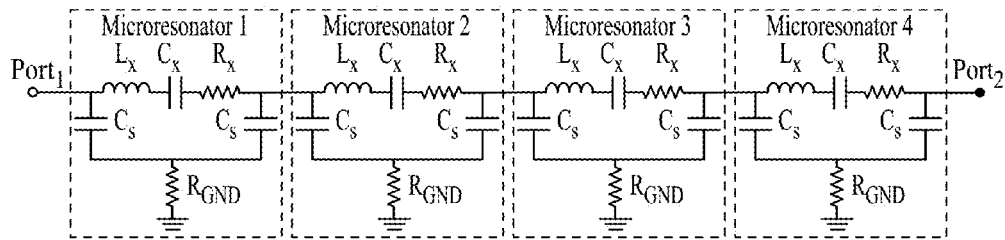
FIG. 1 is an electrical schematic illustrating the equivalent circuit model for a four-pole series-coupled filter.

Specific embodiments to be described below are implemented in aluminum nitride microresonators. Such embodiments are provided as non-limiting examples. Other examples include piezoelectric implementations using lithium niobate, lithium tantalate, or PZT, among other materials, as well as surface acoustic resonators, bulk acoustic resonators, and acoustic resonators of other types.

Resonators and microresonators that include an aluminum nitride (AlN) piezoelectric layer possess numerous benefits, such as small form factor, low cost batch-fabrication, compatibility with CMOS integrated circuits, and frequencies that are definable by lithography (not film thickness). This CAD-definable resonant frequency provides a flexible way to integrate multiple filters operating at different frequencies and bandwidths in a single chip, thus minimizing die-to-die variability and simplifying miniaturization.

Such AlN resonators and microresonators can include any useful stack, such as those having a top electrode layer (e.g., including patterned, periodic electrodes), an AlN layer, a lower electrode layer (e.g., including a metal layer), and an optionally temperature compensation layer (e.g., composed of an insulator, such as silicon dioxide).

In some embodiments, the top layer includes alternating input and output electrodes. To operate, an electrical field is applied between the input electrode and the lower electrode, thereby inducing a strain in the AlN layer though the $d_{31}$ piezoelectric coefficient and laterally propagating a wave. As the wave propagates to the neighboring electrodes, the induced strain is piezoelectrically transduced into an electrical signal.

The pitch p of the periodic electrodes (i.e., the distance between two of the periodic electrodes in the top layer) is half the acoustic wavelength at resonance. Thus, resonant frequency f can be determined by the ratio of the sound velocity v to two times the pitch p (i.e., f=v/2p). In this manner, as pitch can be defined lithographically, the resonant frequency can be defined simply by choosing the appropriate electrode pitch.

Additional details for AlN microresonators are described in B. Kim et al., "AlN microresonator-based filters with multiple bandwidths at low intermediate frequencies," *J. Microelectromech. Syst.*, vol. 22, no. 4 (August 2013) 949-61 (hereinafter Kim 2013), as well as in U.S. Pat. No. 7,385,334, No. 8,367,305, and No. 8,669,823. Each of the abovesaid three references is hereby incorporated herein by reference in its entirety.

In the example embodiment to be described below, we apply our new approach for attenuating spurious responses in the specific context of aluminum nitride micromechanical filters. We demonstrate the technique in a 4-pole self-coupled filter operating at 494 MHz.

A typical resonator in the description below comprises several sub-resonators. For economy of language, we use the same term "resonator" below to refer to both resonators and sub-resonators wherever there is no likelihood of confusion.

Each pole in the device of interest is constituted by a group of parallel-connected resonators. Each resonator has an interdigitated electrode pattern having one, two, three, four, or more electrode fingers. If there is only a single electrode finger, the input signal is typically applied between the electrode finger and a back-side conductor. If there are multiple electrode fingers, there is typically a back-side ground plane, and the fingers alternate between signal input and signal output. In other multiple-electrode designs, the bottom electrode can be used for input and/or output.

The propagation direction of the desired modes is transverse to the direction along which the electrode fingers extend. The response function of the resonator can exhibit peaks corresponding to any of several modal overtones. That overtone which is most prominent will generally correspond to the number of fingers, so that two fingers will emphasize the second overtone, three fingers the third overtone, etc.

Generally, increasing the number of fingers will increase the Q-factor of the resonator. However, because the finger width is fixed (to one-quarter acoustic wavelength), increasing the number of fingers also increases the total width of the resonator. This can have the undesirable effect of increasing the number of spurs. Therefore, although there is a wide range for the possible number of fingers per resonator, it is generally preferable to limit the number to less than ten, typically to only three or four.

In the standard implementation of a 4-pole self-coupled filter, each filter pole is realized using physically identical resonators. The spur mitigation approach reported here realizes the four poles of the filter using two different physical implementations of the resonator. Both resonators were designed to have identical responses at the desired resonant frequency of 494 MHz, whereas many of the spurious responses of the two resonators appear at nonidentical frequencies and as a consequence, they do not add constructively at the filter output.

As a result of the approach described here, the measured attenuation of the largest filter spur was increased by 47.5 dB when compared with a 4-pole filter realized using identical resonators (conventional approach) to form each filter pole. The filter realized using the spur attenuation approach had >59.6 dBc of stopband and spurious response rejection over nearly a 2-GHz frequency span.

Microresonators are miniature acoustic resonators fabricated using integrated circuit (IC) microfabrication techniques. Aluminum nitride (AlN) microresonators, for example, are a promising technology for next generation multi-band radios because the CAD-definable resonant frequency allows many filters and frequency references spanning a wide frequency range (32 kHz-10 GHz) to be fabricated in a small size on a single IC chip.

Microresonator filters can be monolithically integrated with active electronics such as switches and amplifier circuits. These properties allow for the realization of miniature, programmable center frequency filters spanning the high frequency (HF) to X-band range commonly used for communications. Microresonators are also a promising technology for realizing custom filters with low production volumes.

Because a wide range of frequencies can be realized on a single wafer, many different filter designs can be fabricated simultaneously, sharing production costs for low volume applications.

One particularly promising application of AlN microresonator technology is as intermediate frequency (IF) filters in super heterodyne wireless communication architectures. By frequency mixing of the received signal to a fixed intermediate frequency, the super heterodyne architecture offers superior sensitivity, jammer resistance, image rejection and selectivity over the low IF and direct conversion architectures. Super heterodyne radios are commonly used in military communications, cellular phone base stations and other RF systems requiring high performance.

Intermediate frequency filters are often required to have a narrow bandwidth as a percentage of the filter center frequency (% BW). In a super heterodyne radio, the IF filter bandwidth must be wide enough to accommodate both the signal or channel bandwidth and the thermal drift of the filter center frequency with temperature, TCF. A large filter TCF results in excessively wide bandwidth filters that degrade the minimum detectable signal and that increase the required channel spacing, thereby reducing the efficiency of spectrum utilization. For this reason, materials or compensated resonators with low TCF are often used for narrow % BW IF filtering. Some of these resonator types are summarized in Table I.

TABLE I

Comparison of some resonator types available for realizing acoustic filters with high thermal stability

| Device | $k_t^2$ (%) | 1$^{st}$ Order TCF (ppm/° C.) | Wide Range of Resonator Frequencies with Low TCF on a Single Die |
|---|---|---|---|
| ST-Quartz SAW | 0.14 | 0 | Yes |
| SiO$_2$ on 128°-Y X LiNbO$_3$ SAW | 7.4 | 0 | No |
| SiO$_2$ YZ LiTaO$_3$ SAW | 1.4 | 0 | No |
| Temperature Compensated AlN BAW Resonators | 4.3 | 0 | No |
| Temperature Compensated AlN Microresonators in This Work | 1.0 | <6.0 | Range of Nearly 1 Octave |

Although point solution filters at a specific frequency can be realized in temperature compensated LiNbO$_3$ and LiTaO$_3$ surface acoustic wave (SAW) resonators, the thickness of the temperature compensation layer strongly depends on the acoustic wavelength and thus the filter center frequency. Similarly, realizing multiple temperature compensated bulk acoustic wave resonators at different frequencies on a single wafer requires separate thicknesses of both the piezoelectric and temperature compensation layers for each frequency.

Of the technologies in Table I, only ST-cut quartz SAW resonators and AlN microresonators can realize low TCF filters operating over a relatively wide frequency range on a single substrate. This is important for sharing production costs across multiple filters in low volume applications and in adaptive radios, where multiple and adaptive IF frequencies are utilized.

In some embodiments, a silicon dioxide layer can be utilized to thermally compensate the AlN microresonator filters. This can be done using, e.g., the procedure reported in R. H. Olsson et al., "VHF and UHF mechanically coupled aluminum nitride MEMS filters," *IEEE Int'l Frequency Control Symposium*, held on 19-21 May 2008 in Honolulu, Hi., pp. 634-639 (hereinafter, Olsson 2008) and in C. M. Lin et al., "Temperature-compensated aluminum nitride Lamb wave resonators," *IEEE Trans. Ultrason. Ferroelectr. Freq. Control* 57(3) (March 2010) 524-532 (hereinafter Lin 2010). The entirety of each of the abovesaid references is hereby incorporated herein by reference.

The dispersive properties of AlN microresonators limit the range of frequencies that can be thermally compensated using a single silicon dioxide thickness. For example, for the filters with percent bandwidths of ~0.2%, if we allow 20% of the filter 3 dB bandwidth to be utilized to accommodate thermally induced temperature drift, then a TCF of less than ±5.7 ppm/° C. is required for a filter operating over the commercial temperature range from 0 to 70° C. This would allow temperature compensation of filters varying in center frequency by nearly an octave using a single temperature compensation layer.

This range can be further extended by utilizing the high negative TCF of the Al top electrode in the reported fabrication process. By varying the top electrode coverage, the resonator TCF can be shifted by approximately 4 ppm/° C. with minimal impact on the resonator coupling coefficient.

The coupling coefficient, $k_t^2$, of the temperature compensated AlN microresonators reported herein are 7 times higher than ST-cut quartz SAW resonators, expanding the range of achievable filter % bandwidths, which are known to be limited by the resonator coupling coefficient, that can be realized in IF filters requiring high levels of thermal stability. In addition, because of the contour mode ($d_{31}$ based) transduction, AlN microresonators can be matched directly to RF impedances such as 50Ω in a much smaller area than narrow bandwidth SAW and BAW filters at common IF frequencies well below 1 GHz. This reduces size and eliminates the need for large off-chip inductor and capacitor matching components.

While AlN microresonators are promising for IF filtering applications, the large number of symmetric and anti-symmetric Lamb modes that can be efficiently transduced in AlN microresonators results in filters with numerous undesired spurious responses.

Here, we present a new approach for attenuating the spurious responses in electromechanical (or "electroacoustic") filters. Although our approach applies generally to micromechanical filters, the example we provide here is in aluminum nitride micromechanical filters.

Our improved filter is realized from a cascade of resonators with different physical geometries. The different physical resonator implementations are designed to give identical responses at the desired filter center frequency; whereas at least some, and preferably many, of the spurious responses appear at non-identical frequencies from resonator to resonator. As a consequence, the spurious responses are attenuated at the filter output.

In experimental investigations, we observed significant improvement in the attenuation of spurious responses in a 4-pole, self-coupled, temperature compensated AlN micromechanical filter operating at 494 MHz using this approach.

In this regard, useful information pertaining to 4-pole, self-coupled filters may be found in C. Zuo et al., "Very high frequency channel-select MEMS filters based on self-coupled piezoelectric AlN contour-mode resonators," *Sens. Actuat. A* 160(1-2) (2010) 132-140 (hereinafter, Zuo 2010), and in S. Pourkamali et al., "Electrically coupled MEMS bandpass filters; Part I: With coupling element," *Sens. Actuat. A* 122(2) (August 2005) 307-16 (hereinafter, Pourkamali 2005). The entirety of each of the abovesaid references is hereby incorporated herein by reference.

Micromechanical Filter Design and Physical Implementation

In order to demonstrate the spur cancelling approach, two filters were designed. The first, referred to as the conventional, or standard, filter, was formed from a cascade of four stages of identical AlN microresonators each with 4-electrode fingers. The second, referred to as the spur cancelling filter, was formed from a cascade of four stages of AlN microresonators. Two stages were formed from 4-electrode finger AlN microresonators, and two stages were formed from 3-electrode finger AlN microresonators. The standard and spur cancelling filters were designed to have very similar passband responses, whereas the spur cancelling filter was designed to have much higher rejection of spurious modes.

A. Standard Filter Design and Implementation:

An electrical equivalent circuit model for both filters reported in this work is shown in FIG. 1. The 4-pole filter was formed using the self-coupled filter architecture described in detail in Zuo 2010 and in Pourkamali 2005. By coupling the resonators together using the shunt capacitances $C_S$ intrinsic to the resonators, the bandwidth for this architecture was found in Zuo 2010 to be ~0.3 $k_t^2$. As is known in the art, narrower bandwidths can be realized by adding capacitance in parallel with $C_S$, while wider bandwidths are achievable by adding inductance in parallel with $C_S$.

The isolation of each resonator is limited by the shunt capacitors and the ground return resistance, $R_{GND}$, in FIG. 1. The self-coupled architecture was chosen here to ensure large out-of-band rejection, and the number of poles, four, was chosen to ensure both large out-of-band rejection and steep filter skirts. A direct 50Ω termination was desired for the filter to avoid large off-chip matching components. A secondary goal of this work was to maximize the filter bandwidth while using the self-coupled filter architecture.

Figure 2:
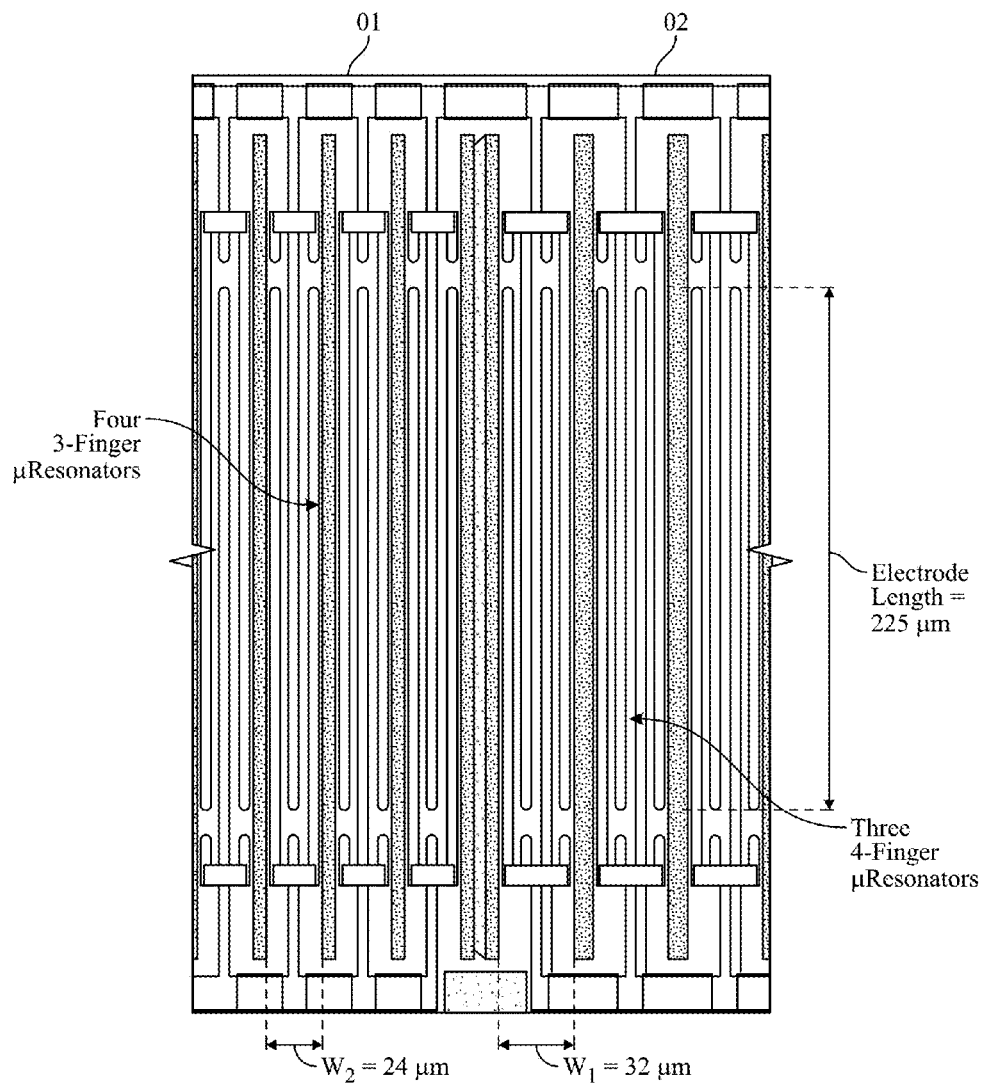
FIG. 2 is a top-down view of an example filter assembly consisting of a plurality 01 of three-finger microresonators and a plurality 02 of four-finger microresonators. The same assembly is depicted in cross section in FIG. 6.
Figure 2A:
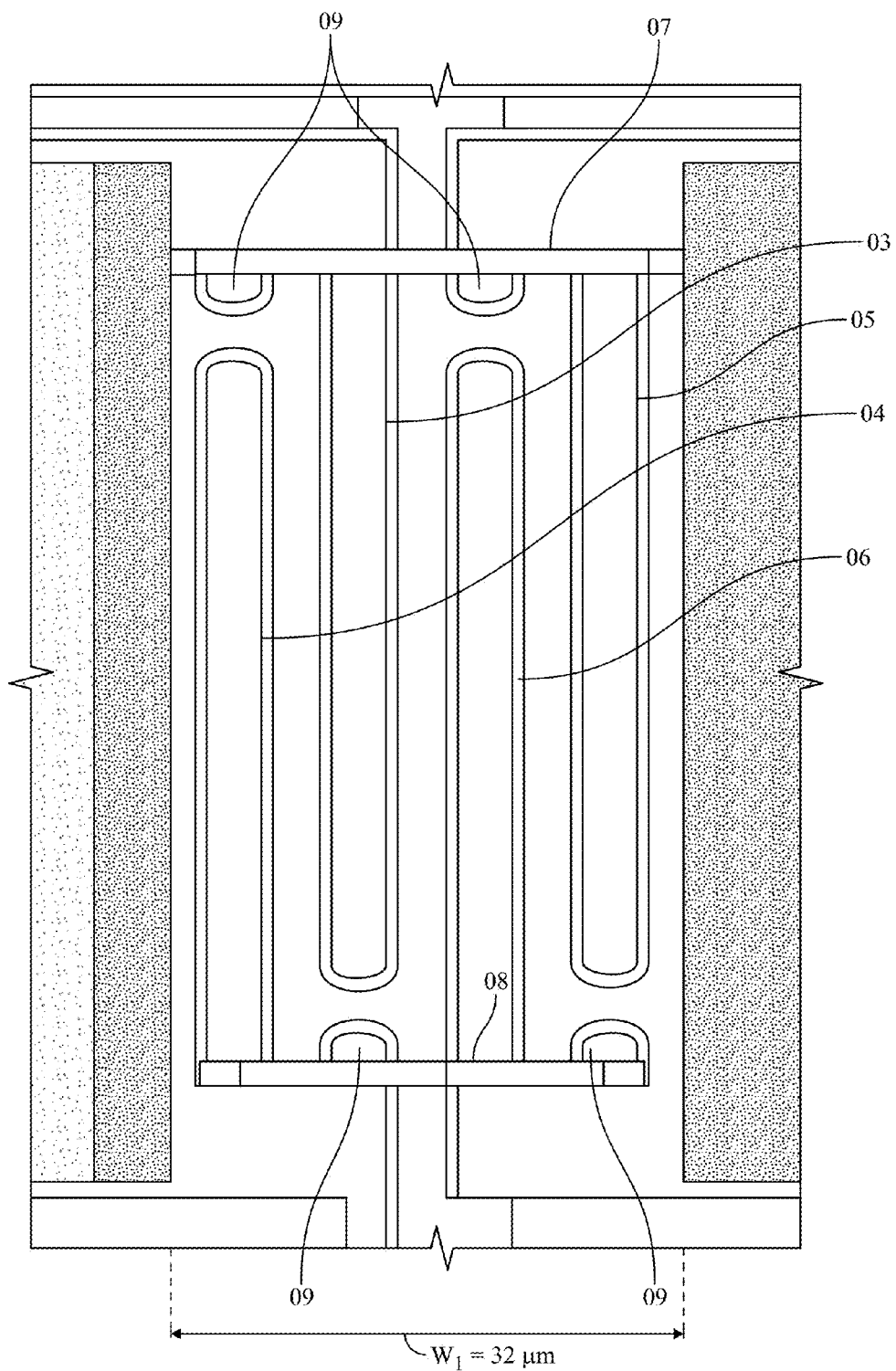
FIG. 2A is a detail of FIG. 2 with exaggerated horizontal scale to more clearly show an example of a 4-finger microresonator. As seen in the figure, electrode fingers 03 and 05 are connected to input (or output) bus 07, and electrode fingers 04 and 06 are connected to output (or input) bus 08. Stubs 09 are provided, according to known techniques, to suppress undesired longitudinal modes of vibration.

Prior to the design of the filters, a single, 4-electrode, temperature compensated AlN microresonator, such as one of the repeated filter elements in FIG. 2 and FIG. 2A, was measured to have a $k_t^2$ of 1%, a quality factor, Q, of 2100, a low TCF, and the equivalent circuit parameters in the second row of Table II. This microresonator was also found to have no spurs in close proximity to the desired resonance at 494 MHz and was thus a good resonator device for implementing the higher order, self-coupled filter design.

resonator, the total shunt capacitance, and thus device area, of the previously measured four-electrode microresonator must be increased by a factor of 17. This was because scaling of the motional impedance is directly linked to the shunt capacitance through the resonator $k_t^2$ and Q.

Reducing the resonator motional impedance can be accomplished in several ways, including increasing the length or aperture of the electrodes, increasing the number of electrodes, or connecting resonators in parallel. Because we understood that increasing either the aperture or the number of electrodes would alter the Q, stop band rejection, and most importantly the spurious responses of the resonator, we chose to array resonators in parallel to achieve the lower impedance required to obtain a direct 50Ω match for the filter. This allowed the filter to be realized from a resonator with known electrical properties.

When realizing an equivalent resonator with lower motional impedance by arraying higher impedance sub-resonators in parallel, it is important that the resonant frequencies of the sub-resonators match. If the frequency matching of the sub-resonators is poor, an equivalent resonator with multiple resonant peaks will be observed. In the self-coupled filters reported herein, it was critical for filter performance that both the microresonators arrayed in parallel to form a low impedance equivalent resonator, and the equivalent resonators that form each filter pole, had a high degree of frequency matching. Mismatch in the resonant frequencies of the devices will lead to poor filter performance.

Figure 3:
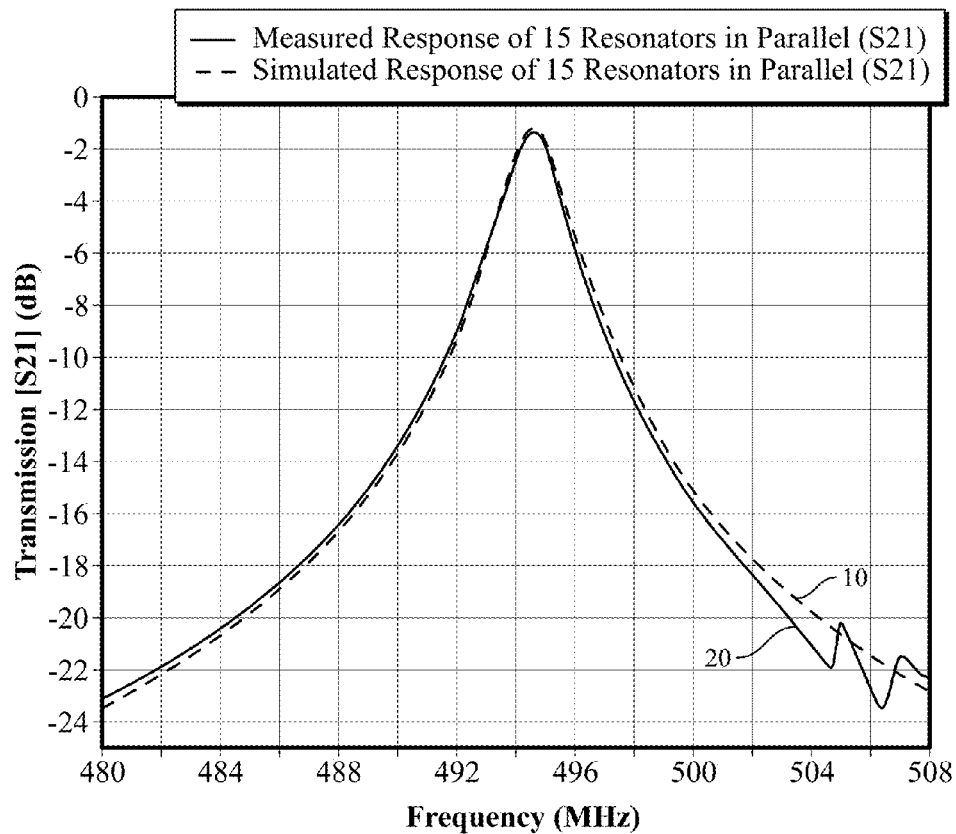
FIG. 3 is a plot showing the experimentally measured response of a filter assembly consisting of fifteen parallel-connected four-electrode aluminum nitride microresonators. For comparison, a theoretical response curve 10 obtained from simulations is shown superimposed on the experimental curve 20.

Shown in FIG. 3 is the experimentally measured response 20 of fifteen 4-electrode finger, AlN microresonators connected in parallel to form an equivalent resonator with 15 times lower motional impedance. This equivalent resonator

TABLE II

Equivalent circuit values for the micromechanical filter shown in FIG. 1

| Circuit Element | Motional Resistance ($R_x$) | Motional Capacitance ($C_x$) | Motional Inductance ($L_x$) | Shunt Capacitance ($C_s$) | Ground Return Resistance ($R_{GND}$) |
|---|---|---|---|---|---|
| Measured Values for a Single 4-Finger Microresonator | 112.2 Ω | 1.37 fF | 76.0 μH | 0.34 pF | 3 Ω |
| Measured Values for 15, 4-Finger Microresonators Connected in Parallel | 6.9 Ω | 22.1 fF | 4.7 μH | 5.2 pF | 0.2 |
| Modeled Values for Seventeen 4-Finger Microresonators Connected in Parallel | 6.6 Ω | 23.3 fF | 4.47 μH | 5.73 pF | 0.18 |
| Modeled Values for Twenty Two 3-Finger Microresonators Connected in Parallel | 6.8 Ω | 22.6 fF | 4.61 μH | 5.56 pF | 0.17 |

Agilent Genesys RF and microwave design software was used to simulate the filters. A maximum 3 dB bandwidth of 1.2 MHz was found at a center frequency of 494 MHz using the previously measured $k_t^2$ and Q values for the single 4-electrode resonator.

In order to achieve the desired 50Ω filter termination without the use of off-chip matching components, the values in the fourth row of Table II were found using the RF simulator. In particular, a desired motional impedance of 6.6Ω was found for each microresonator in FIG. 1, whereas the motional impedance of a single, 4-electrode microresonator was measured to be 112.2Ω. To realize a 6.6Ω microwas measured on the same wafer as the filters reported herein. Also shown in FIG. 3 is the simulated response 10 of a resonator with a resonant frequency of 493.8 MHz, a shunt capacitance of 5.2 pF, a Q of 2100, and a $k_t^2$ of 1.05%.

The equivalent circuit values used to fit the measured response of the parallel array of 15, 4-electrode finger AlN microresonators are summarized in row 3 of Table II. Despite being realized from 15 parallel microresonators, the measured equivalent resonator is in good agreement with the simulated response of an ideal resonator without frequency mismatch. Furthermore, the $k_t^2$ and Q values are in good agreement with the previously measured values for a single 4-electrode finger microresonator fabricated on a previous mask design and lot of wafers.

Several examples of self-coupled AlN microresonator filters have been reported in the literature, for example in R. H. Olsson et al., "Origins and mitigation of spurious modes in aluminum nitride microresonators," *Proc. IEEE Ultrason. Symp.*, held on 11-14 Oct. 2010 in San Diego, Calif., pp. 1272-1276, (hereinafter, Olsson 2010), C. Zuo C et al., "Very high frequency channel-select MEMS filters based on self-coupled piezoelectric AlN contour-mode resonators," *Sens. Actuat. A* 160(1-2) (2010) 132-40, (hereinafter, Zuo 2010), R. H. Olsson et al., "A programmable bandwidth aluminum nitride microresonator filter," *Proc. Govt. Microcircuit Appl. Critical Tech. Conf.*, held on 11-14 Mar. 2013 in Las Vegas, Nev., pp. 277-280 (hereinafter, Olsson 2013), and M. Rinaldi M et al., "AlN contour-mode resonators for narrow-band filters above 3 GHz," *Proc. IEEE Int. 22nd Eur. Freq. Time Forum Freq. Control Symp.*, held on 20-24 Apr. 2009 in Besancon, France, pp. 70-74 (hereinafter, Rinaldi 2009).

The filters described in the above-cited references all used the same device to implement each filter pole or resonator. This conventional approach of using identical devices to realize all the filter poles in a series coupled filter is also considered here and is illustrated by FIG. 4.

Figure 4:
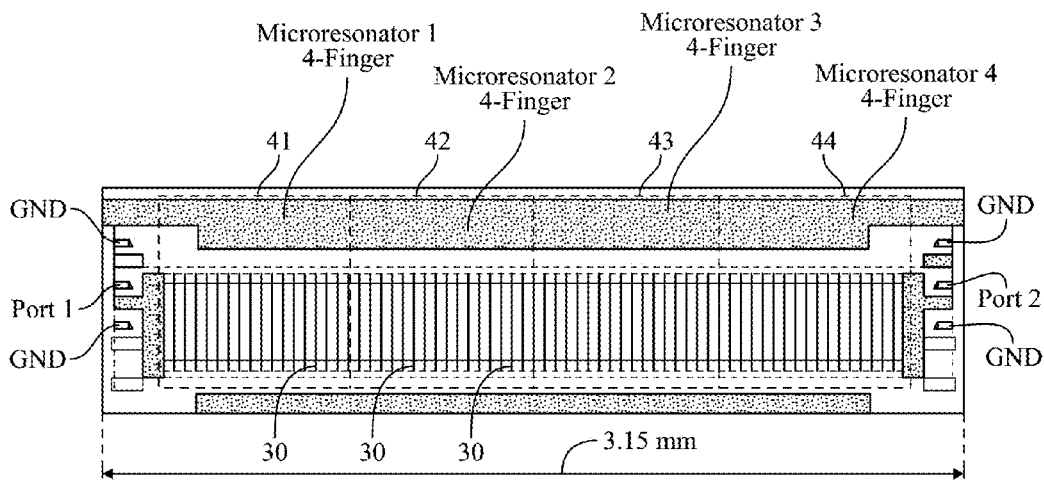
FIG. 4 provides a top-down view of a conventional physical implementation of the four-pole series-coupled micromechanical filter of FIG. 1, in which identical resonators are used to realize each filter pole. In this exemplary filter array, seventeen four-finger microresonators 30 are utilized to form a resonator at each pole 41-44.
Figure 5:
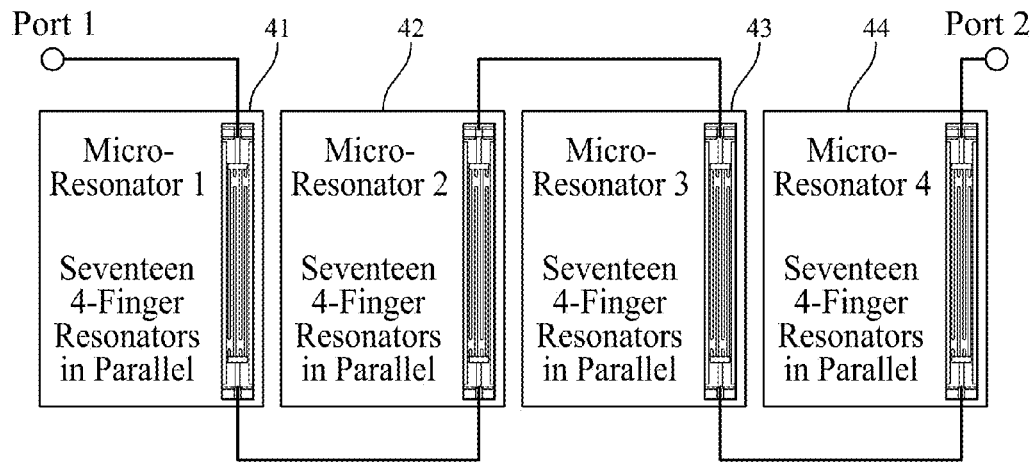
FIG. 5 is a block diagram of the four-pole, self-coupled filter of FIG. 4, which is formed from the series connection of four identical resonators. As noted above, each resonator was formed from the parallel electrical connection of seventeen, four-finger microresonators.

FIG. 5 shows a schematic representation of the filter in FIG. 4, in which each of the four resonators 41-44 from FIG. 1 are implemented using the parallel combination of seventeen, 4-electrode finger temperature compensated AlN microresonators to achieve the equivalent resonator parameters listed in the 4th row of Table II.

Figure 6:
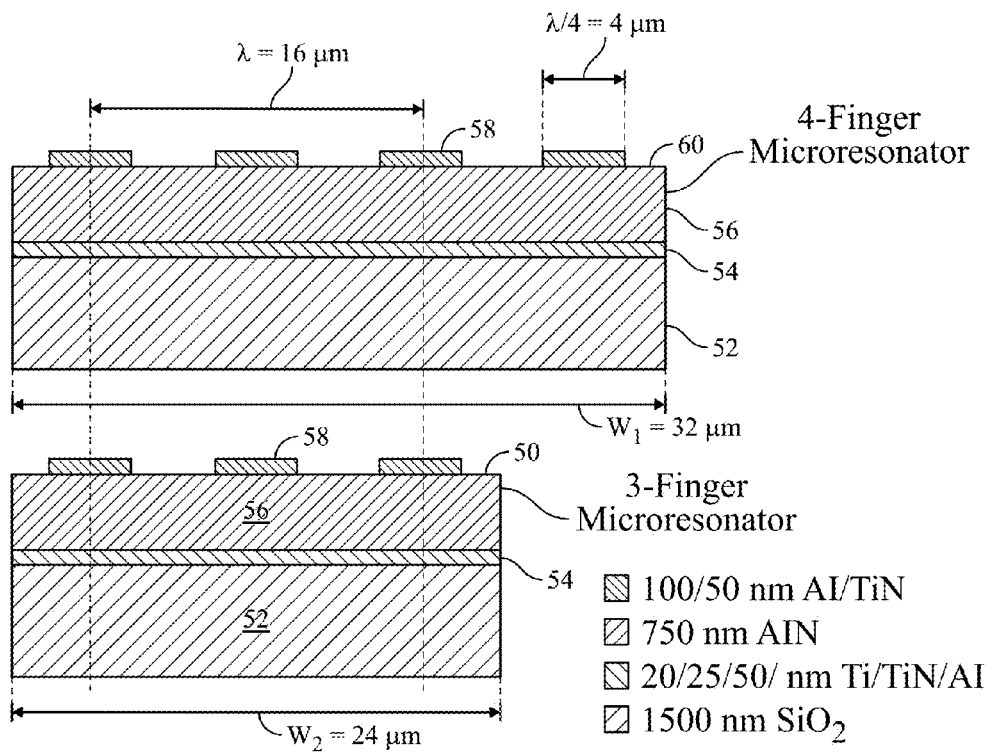
FIG. 6 is a notional, cross-sectional diagram of exemplary three-finger (50) and four-finger (60) temperature-compensated aluminum nitride microresonators.

The 4-finger microresonator is depicted in cross section in a portion of FIG. 6, and a top down image of three, 4-finger AlN microresonators electrically connected in parallel is shown in FIG. 2. The microresonators of FIG. 6 were formed from a composite stack of a 1500 nm thick $SiO_2$ temperature compensation layer 52, a 20/25/50 nm thick Ti/TiN/Al bottom electrode 54 that was electrically connected to ground, a 750 nm thick piezoelectric AlN layer 56, and a 100/50 nm thick Al/TiN top electrode layer 58 that forms the input and output fingers of the resonator.

The AlN microresonators were fabricated using the process reported in Olsson 2013. A detailed discussion of microresonator operation can be found in Kim 2013. The entirety of each of the abovesaid references is hereby incorporated herein by reference.

The 4-finger microresonator depicted in FIG. 2 and FIG. 6 was designed to operate in the 4th overtone of the S0 Lamb mode at 494 MHz, corresponding to a wavelength of 16 μm and a sound velocity of 7900 m/s. Table II (2nd row) provides the electrical equivalent circuit parameters of a single AlN microresonator with an electrode length of 225 μm, an electrode width of 4 μm, and two input and two output fingers per microresonator. Seventeen, 4-finger electrode microresonators were connected in parallel to realize each filter pole shown in FIG. 1 and achieve the desired shunt capacitance and motional parameters listed in the 4th row of Table II.

Figure 7:
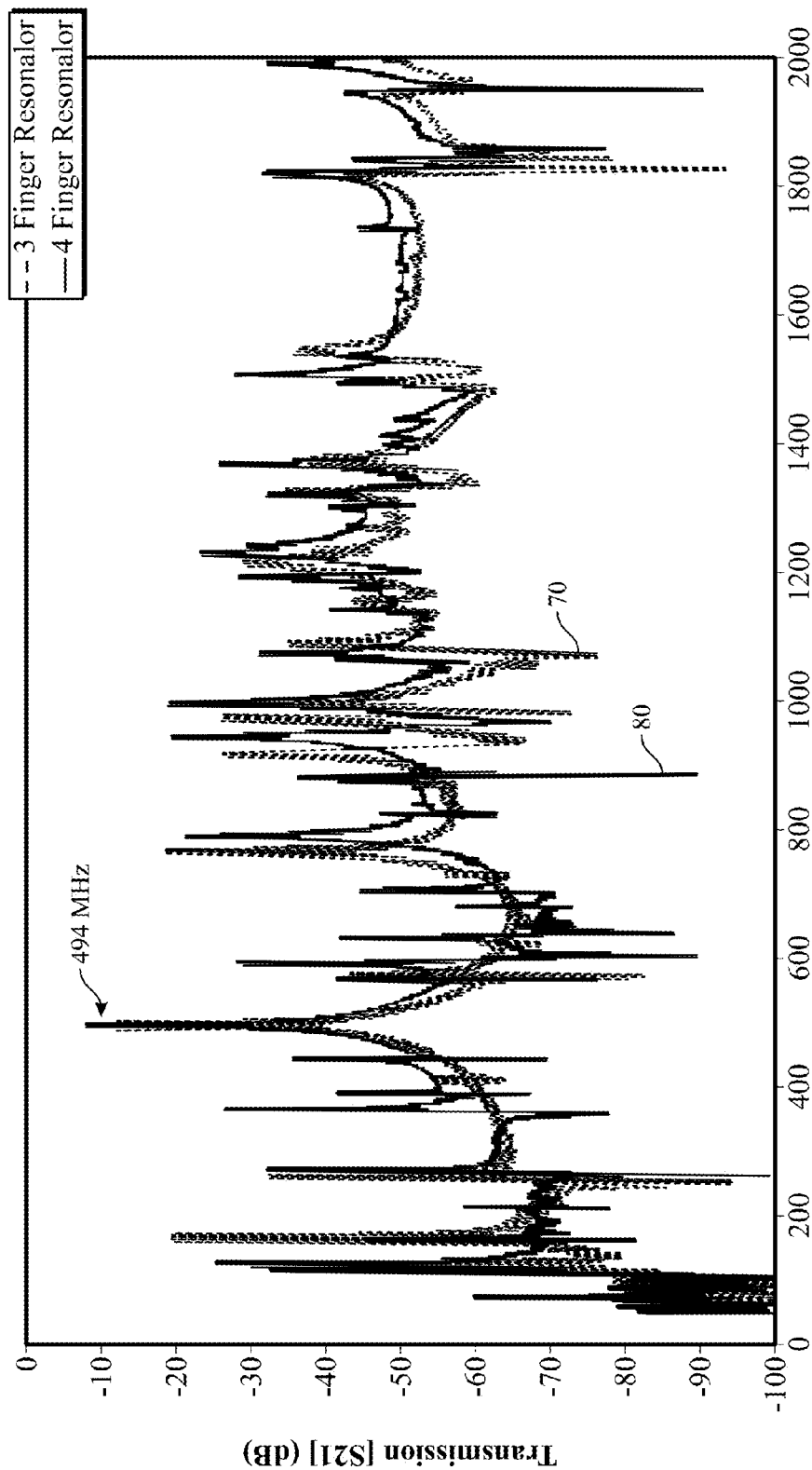
FIG. 7 is a plot showing the experimentally measured transmission of a single three-finger (70) and of a single four-finger (80) aluminum nitride micromechanical resonator.

B. Spur Reduction Technique and Filter Implementation:

The response of a single, 4-finger AlN microresonator measured from 50 to 2000 MHz in 97.5 kHz steps is shown as curve 80 in FIG. 7. The desired 4th overtone of the S0 Lamb mode appeared at the designed frequency of 494 MHz. Also visible in FIG. 7 are the numerous spurs that exist in the microresonator response. In a conventional self-coupled filter such as that shown in FIG. 4, each additional filtering stage increased the spur rejection by the ratio of the height of the desired mode (at 494 MHz in this case) to the height of the spur. Clearly many stages of filtering are needed to sufficiently reject the numerous spurs. Adding filter stages, however, increases size, cost, and insertion loss, while lowering yield.

Also shown in FIG. 7 as curve 70 is the measured transmission response of a single, 3-finger AlN microresonator. This resonator was also depicted in cross section in FIG. 6 and was formed from the same layer stack on the same wafer as the 4-finger microresonator. The 3- and 4-finger microresonators were both realized using the fabrication process of Olsson 2013. Only the CAD layout was altered to form the two designs.

The example microresonator assembly of FIG. 2 and FIG. 6 consisted of a plurality of three-finger microresonators and a plurality of four-finger microresonators. The electrode length was 225 μm for each microresonator. Four, 3-finger microresonators connected in parallel were electrically equivalent to three, 4-finger microresonators connected in parallel at the desired filter frequency of 494 MHz. The 3-finger microresonators were alternately inverted; that is, every other 3-finger microresonator was flipped along the vertical axis, such that the same number of electrode fingers are seen from the top and bottom parallel microresonator connections.

The 3-finger microresonator depicted in FIG. 2 and FIG. 6 was designed to operate in the 3rd overtone of the S0 Lamb mode at 494 MHz corresponding to a wavelength of 16 μm and a sound velocity of 7900 m/s. Because the 3- and 4-finger microresonators have different overall widths, many of the spurious responses of the two microresonators occurred at different frequencies. For example, the fundamental S0 Lamb mode for the 4-finger microresonator occurred at a wavelength of 64 μm, corresponding to a frequency of 123 MHz, whereas the fundamental S0 Lamb mode for the 3-finger microresonator occurred at a wavelength of 48 μm, corresponding to a frequency of 165 MHz.

Similarly, the fundamental and overtones of the antisymmetric Lamb modes also occurred at different frequencies in the 3- and 4-finger microresonators. This can be seen in the plot of FIG. 7, which as explained above shows the experimentally measured transmission 70 of a single three-finger and the experimentally measured transmission 80 of a single four-finger aluminum nitride micromechanical resonator.

The measurements of FIG. 7 were taken from 50 to 2000 MHz in 0.0975-MHz steps. It will be seen that both devices showed a strong response at 494 MHz corresponding to the 3rd (3-finger) and 4th (4-finger) overtones of the desired S0 Lamb mode.

To summarize, the measured responses of the 3- and 4-finger microresonators both exhibited numerous strong spurious resonances. However, the strong spurious modes rarely coincided at the same frequency for both devices. Thus, when a 3-finger resonator was connected in series with a 4-finger resonator in a self-coupled filter, the spurious responses were much more heavily attenuated than in the case when two identical resonators were used.

Turning back to FIG. 2, it will be seen that a top down image 01 of four, 3-finger AlN microresonators electrically connected in parallel is displayed next to the array 02 of three, 4-finger microresonators. The electrode lengths and widths of the 3- and 4-finger resonators were identical. Thus, the arrays of 3 and 4-finger devices electrically connected in parallel in FIG. 2 had identical electrical equivalent circuit models in the desired mode of operation ($R_X$, $C_X$, $L_X$, $C_S$).

With further reference to FIG. 2, every other 3-finger microresonator was flipped along the vertical axis of the resonator, as already noted above, to ensure that the same number of electrode fingers were seen from the top and bottom of the parallel resonator connections. Twenty-two 3-finger microresonators were connected in parallel to realize a single filter pole. The electrodes were 225 µm in length and 4 µm in width. There was an average of 1.5 input and 1.5 output fingers per resonator. The equivalent circuit is shown in FIG. 1. The assembly was designed to have the desired shunt capacitance and motional parameters listed in the final row of Table II. Note from Table II that the equivalent circuit models of seventeen 4-finger AlN microresonators connected in parallel and twenty two 3-finger AlN microresonators connected in parallel were nearly identical.

It should be noted that the measured coupling coefficient of the 3-electrode finger microresonator shown in FIG. 7 was 0.96%, and was slightly lower than the value of 1% measured for a single 4-electrode finger microresonator. A measured 3-electrode finger microresonator was not available at the time of the filter design. The reduced coupling coefficient can be attributed to the added capacitance of the bus traces 07, shown in FIG. 2, that route to the resonators. These interconnect traces have equivalent dimensions for both the 3- and 4-electrode resonators. Since the shunt capacitance of a single 4-electrode microresonator was 1.5 times higher than that of a single 3-electrode microresonator, the 3-electrode finger microresonator coupling coefficient was slightly more degraded by the interconnect capacitance.

Figure 8:
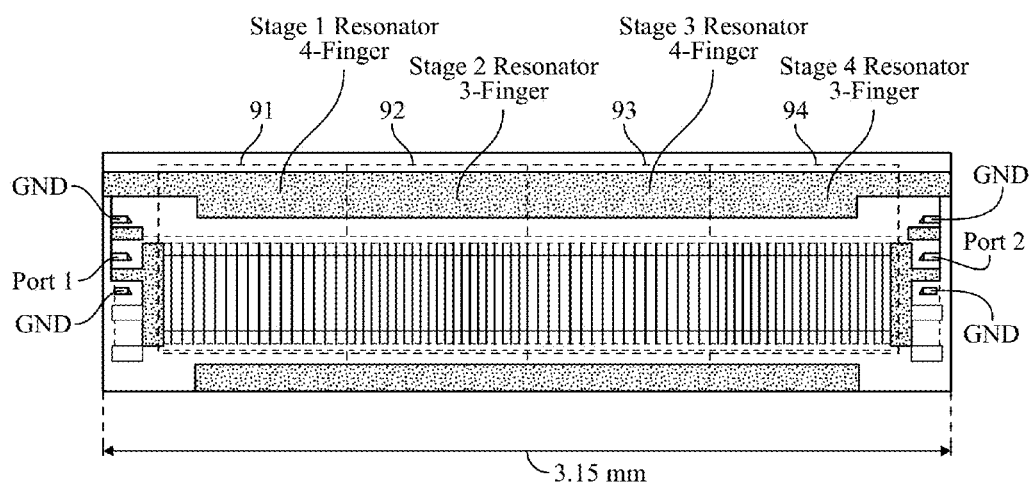
FIG. 8 is a top-down view of a spur-cancelling implementation of a four-pole series-coupled micromechanical filter similar to the filter of FIG. 1, but in which the resonators used to realize each filter pole have different physical implementations. In the example that the figure represents, seventeen four-finger microresonators 91, 93 are used to realize Stage 1 and 3 resonators, whereas twenty-two three-finger microresonators 92, 94 are used to realize Stage 2 and 4 resonators.
Figure 9:
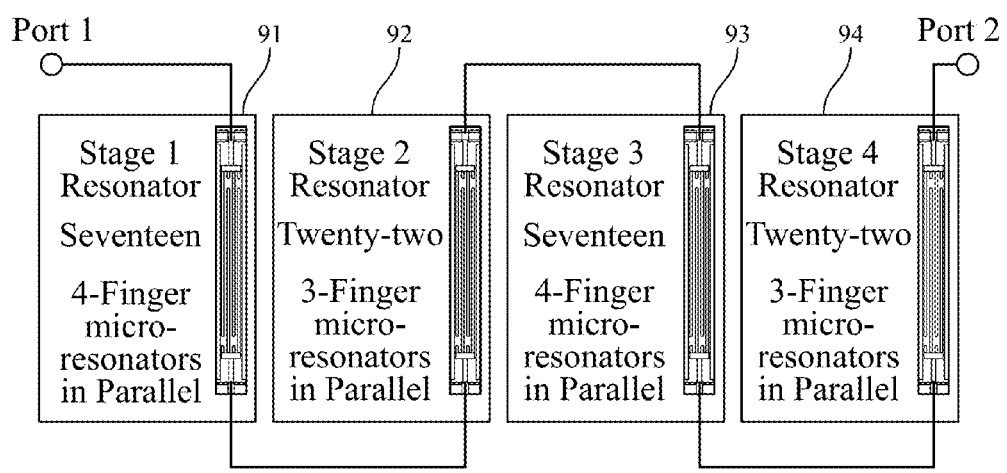
FIG. 9 is a block diagram of the spur-cancelling four-pole, self-coupled filter of FIG. 8. As shown, two of the filter poles were formed from the parallel electrical connection of seventeen, four-finger microresonators whereas the other two filter poles were formed from the parallel electrical connection of twenty-two three-finger microresonators.

An image of a 4-pole, spur cancelling filter is shown in FIG. 8 and is schematically depicted in FIG. 9. Resonators 91 and 93 were implemented using a parallel combination of seventeen, 4-electrode finger temperature compensated AlN microresonators. In contrast, the other two poles 92 and 94 were formed from the parallel combination of twenty two, 3-electrode finger temperature compensated AlN microresonators.

From Table II, it was not possible to exactly match the shunt capacitance of the 3 and 4-electrode finger microresonator arrays, with the 3-electrode finger array having a slightly lower total shunt capacitance. The combined effects of slightly lower resonator $k_t^2$ and slightly lower total shunt capacitance are expected to result in a slightly narrower bandwidth for the spur cancelling filter.

Measured Results and Discussion

Figure 10:
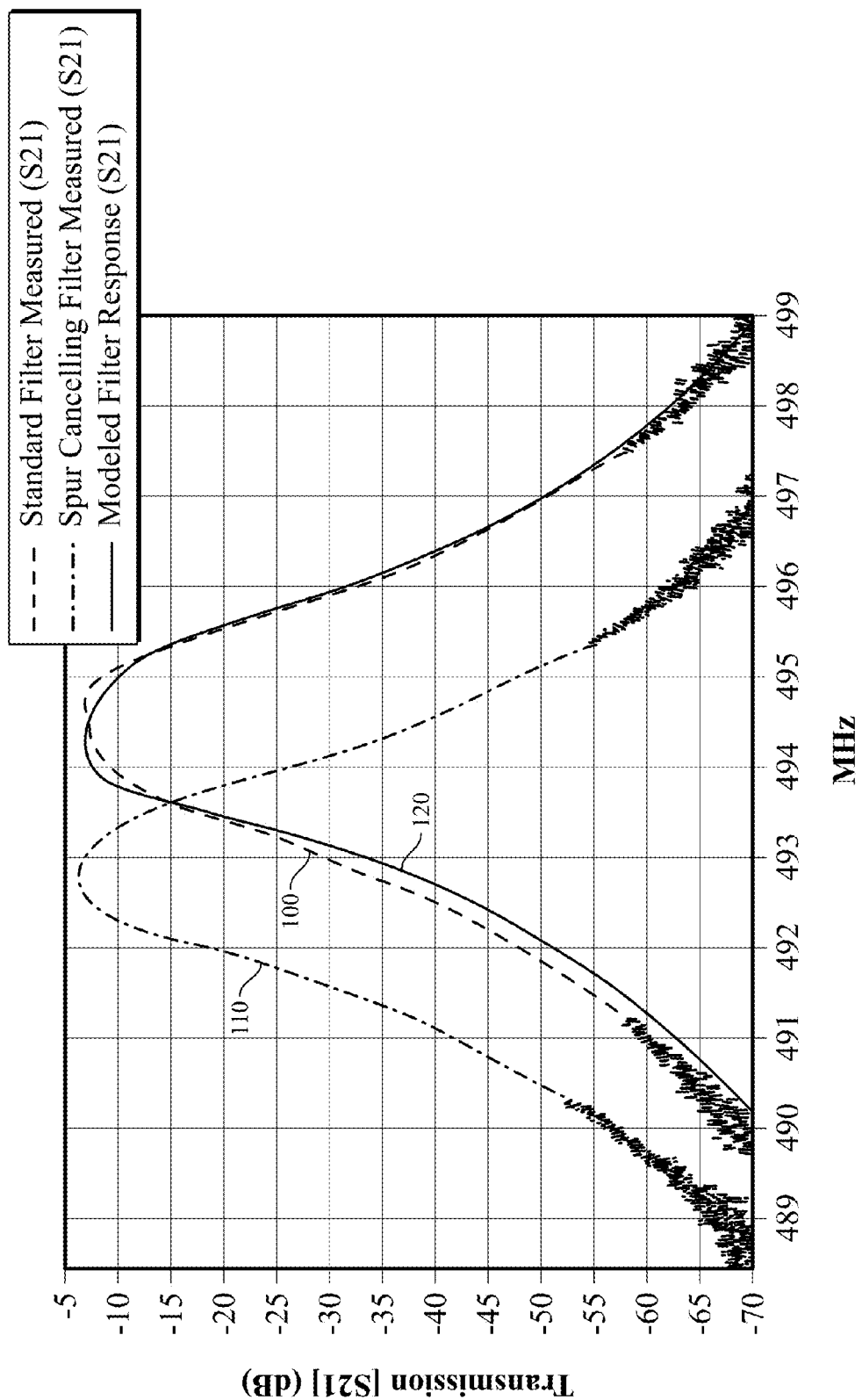
FIG. 10 is a plot of the experimentally measured responses of the conventional filter of FIG. 4 (100) and the spur-cancelling filter of FIG. 8 (110). For comparison, a theoretical curve 120, obtained from simulations, is also provided for the response of the conventional filter.
Figure 11:
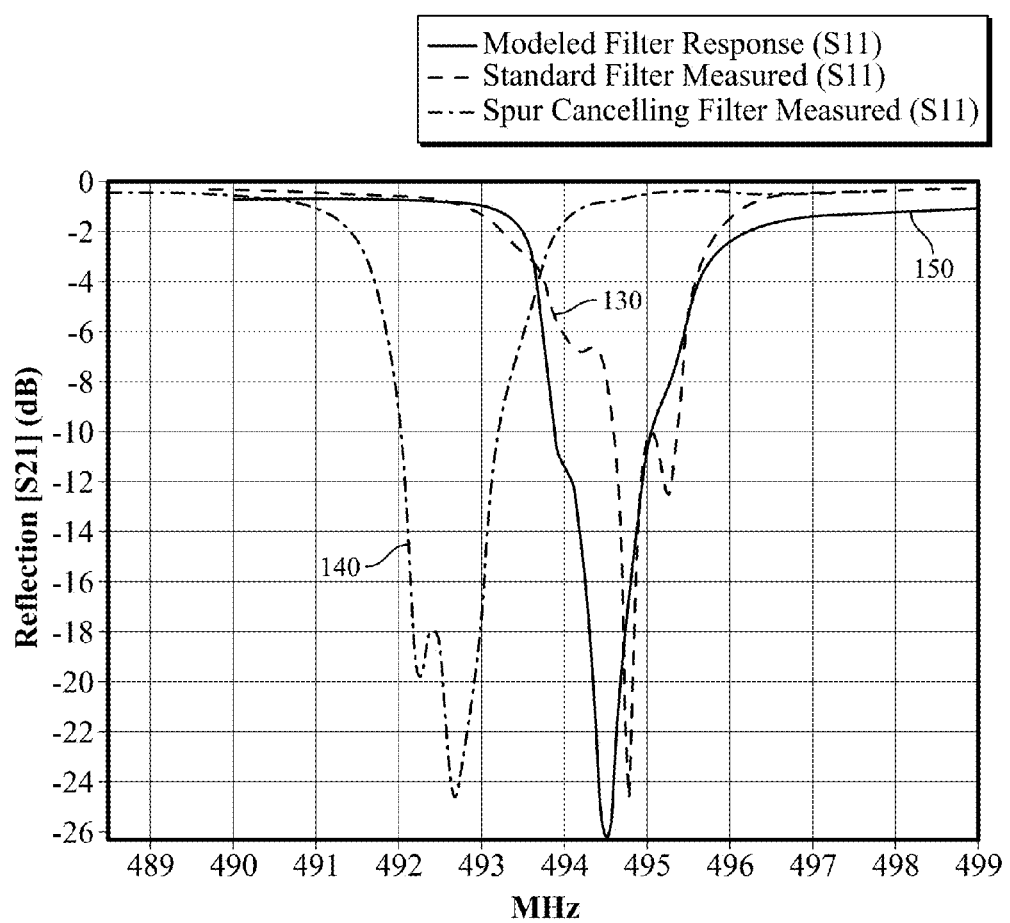
FIG. 11 is a plot of the experimentally measured reflection spectra of the conventional filter of FIG. 4 (130) and the spur-cancelling filter of FIG. 8 (140). For comparison, a theoretical curve 150, obtained from simulations, is also provided for the conventional filter.

The transmission [S21] and reflection [S11] measured with direct 50Ω termination across a narrow frequency range for the standard and spur cancelling 4-pole filters are shown in FIG. 10 and FIG. 11 by curves 100 and 130, respectively, for the standard filter and by curves 110 and 140, respectively, for the spur-cancelling filter. The filter responses were measured in air on a probe station using a vector network analyzer with a SOLT calibration performed to the ends of the RF probes. The simulated response of the filter in FIG. 1, using the circuit values from the 4th row of Table II, is also shown in FIG. 10 and FIG. 11 by curves 120 and 150, respectively.

As seen in FIG. 10, there was a small shift in center frequency between the conventional filter 100 and the spur-cancelling filter 110. We attribute this shift to chemical mechanical polishing non-uniformity, which resulted in slightly different oxide thicknesses for the two filters, which were located 10.5 mm apart in the same reticle. Otherwise, the measured in-band performance of the standard and spur cancelling filters were similar and in good agreement with the simulated filter response.

FIG. 11 shows that an in-band return loss of <−18 dB was obtained for the spur cancelling filter 140.

Table III summarizes the simulated and measured filter performance. The slight shift in center frequency seen between the standard and spur cancelling filter designs was due to chemical mechanical polishing non-uniformity, which resulted in slightly different resonator oxide thicknesses (the oxide layer [reference numeral] is shown in FIG. 6) for the two filters that were located 10.5 mm apart in the same reticle.

TABLE III

Simulated and measured performance of the standard and spur cancelling 4-pole micromechanical filters

| Filter | Center Frequency (MHz) | Insertion Loss (dB) | 3 dB Bandwidth (MHz) | 20 dB Shape Factor (MHz) | 40 dB Shape Factor (MHz) | Ultimate Attenuation (dBc) |
|---|---|---|---|---|---|---|
| Simulated | 494.4 | 6.9 | 1.2 | 2.2 | 3.8 | N/A |
| Standard Measured | 494.5 | 6.7 | 1.2 | 2.2 | 3.9 | 93.3 |
| Spur Cancelling Measured | 492.8 | 6.2 | 1.0 | 2.3 | 4.1 | 93.8 |

Figure 12:
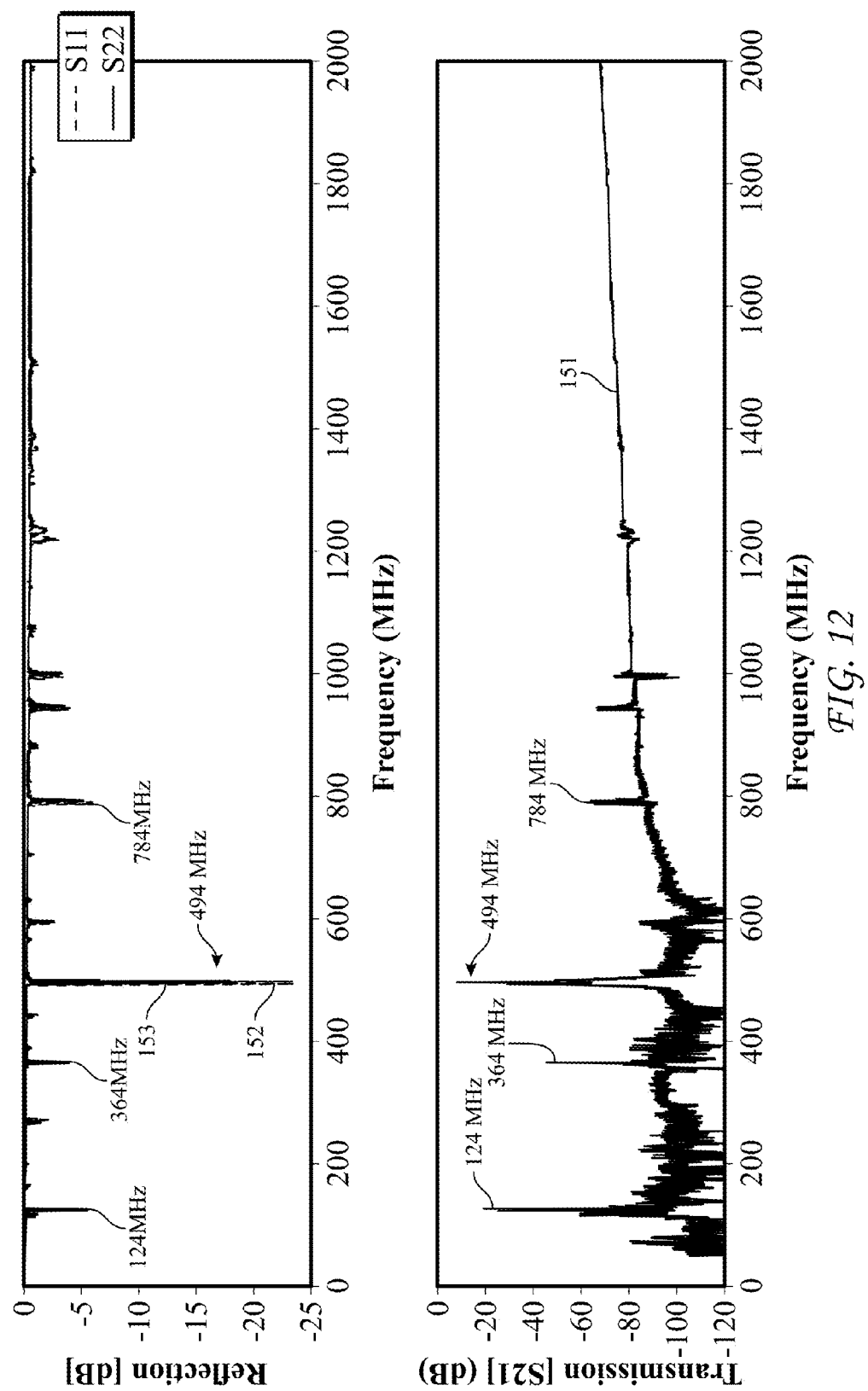
FIG. 12 provides plots of the experimentally measured wideband transmission (lower plot) and reflection (upper plot) responses for the conventional filter of FIG. 4. Several large spurious responses are visible.

The transmission [S21], reflection [S11], and reflection [S22] responses of the standard filter measured from 50 MHz to 2 GHz in 97.5 kHz steps are shown in FIG. 12 by curves 151, 152, and 153, respectively. The standard filter achieved a minimum insertion loss of 6.7 dB, a return loss <−15 dB into 50Ω, and an ultimate rejection of 93.3 dBc. Whereas the filter rejection is generally very high outside the filter passband, several large spurious responses were seen, the largest of which are summarized in Table IV. The largest spur occurred at the fundamental S0 Lamb wave frequency of the 4-finger resonator at 124.3 MHz at a wavelength of 32 µm and was only rejected by 12.1 dBc, when compared to the desired filter response at 494 MHz.

Figure 13A:
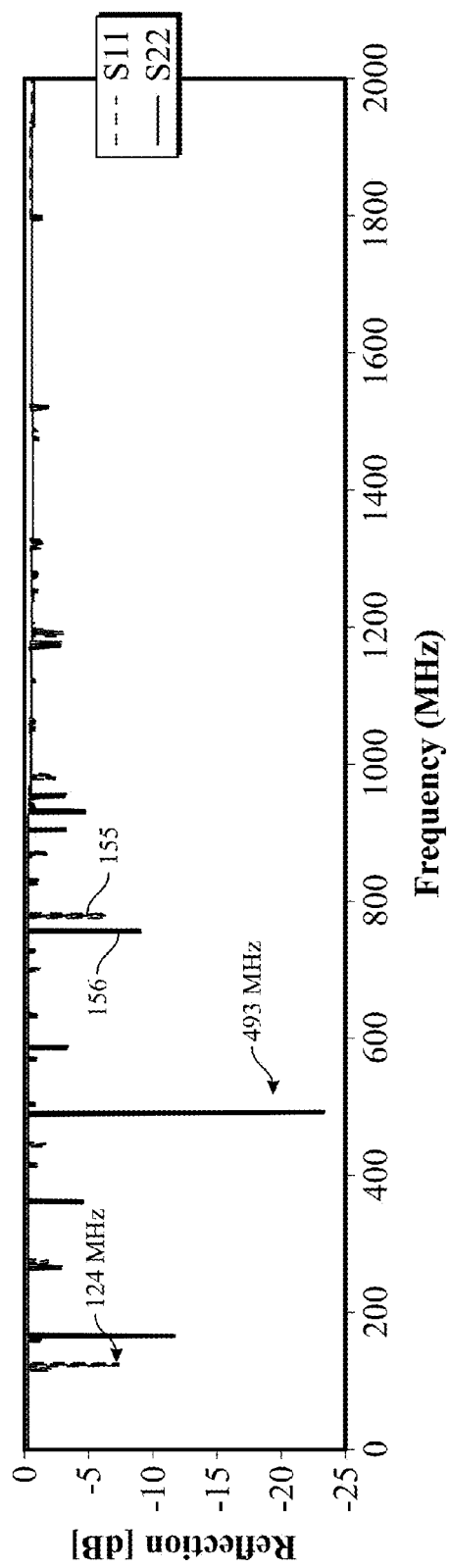
FIG. 13 provides plots of the experimentally measured wideband transmission (lower plot) and reflection (upper plot) responses for the spur cancelling filter of FIG. 8. As seen in the figure, the large spurious response at 124.3 MHz of the conventional filter as seen in FIG. 12 is now attenuated by 47.5 dB. Other spurious resonances have been attenuated below the stop band rejection of the filter and are consequently no longer visible.
Figure 13B:
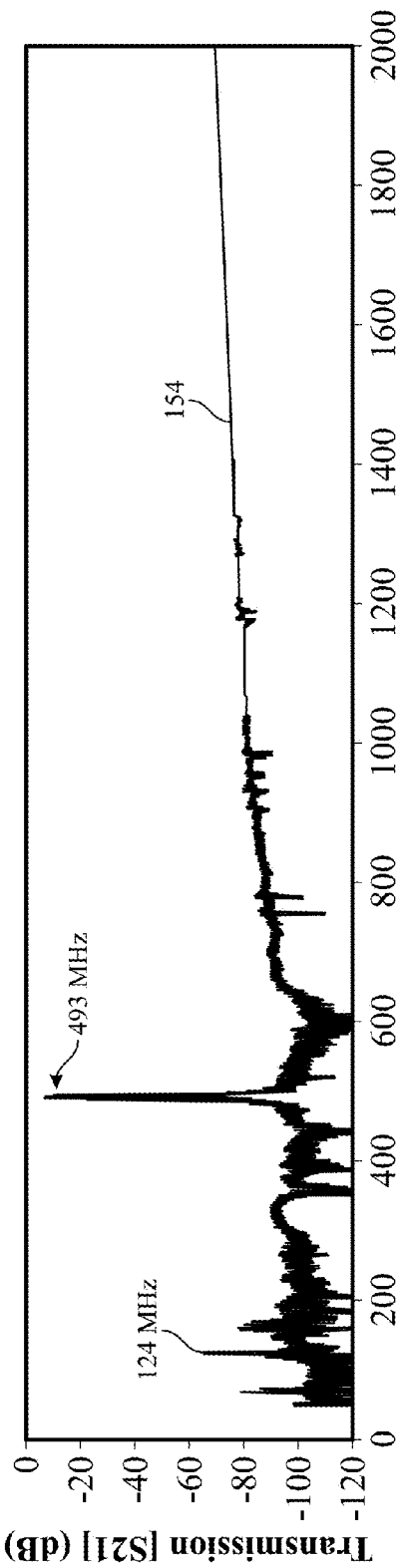

The transmission [S21], reflection [S11], and reflection [S22] responses of the spur cancelling filter measured from 50 MHz to 2 GHz in 97.5 kHz steps are shown in FIG. 13 by curves 154, 155, and 156, respectively. The spur cancelling filter achieved a minimum insertion loss of 6.2 dB, a return loss <−18 dB into 50Ω, and an ultimate rejection of 93.8 dBc. The large spur from the fundamental S0 Lamb mode of the 4-finger resonator at 124.3 MHz seen in the standard filter was now rejected by 59.6 dBc, an improvement of 47.5 dB. All other spurs were rejected by greater than 72 dBc from 50 MHz to 2 GHz, as shown in Table IV.

Further insight into the spur cancellation can be gained by comparing the return loss plots [S11, S22] for the standard (FIG. 12, curves 152 and 153, respectively) and spur cancelling filters (FIG. 13, curves 155 and 156, respectively). Since the resonators seen at port 1 and port 2 in the standard filter were identical, S11 and S22 were nearly identical both at the desired filter center frequency of 494 MHz and for all the spurious modes of the 4-finger resonator. The resonators seen at port 1 and port 2 in the spur cancelling filter, however, were not identical. Thus, S11 and S22 were nearly identical at the filter center frequency of 493 MHz but rarely overlapped outside of this frequency.

As seen in FIG. 13, the large spurious response that FIG. 12 shows at 124.3 MHz for the conventional filter is now attenuated by 47.5 dB because the 4- and 3-finger microresonators used to implement the spur cancelling filter had different fundamental S0 Lamb mode wavelengths of 32 µm and 24 µm, respectively.

Figure 14:
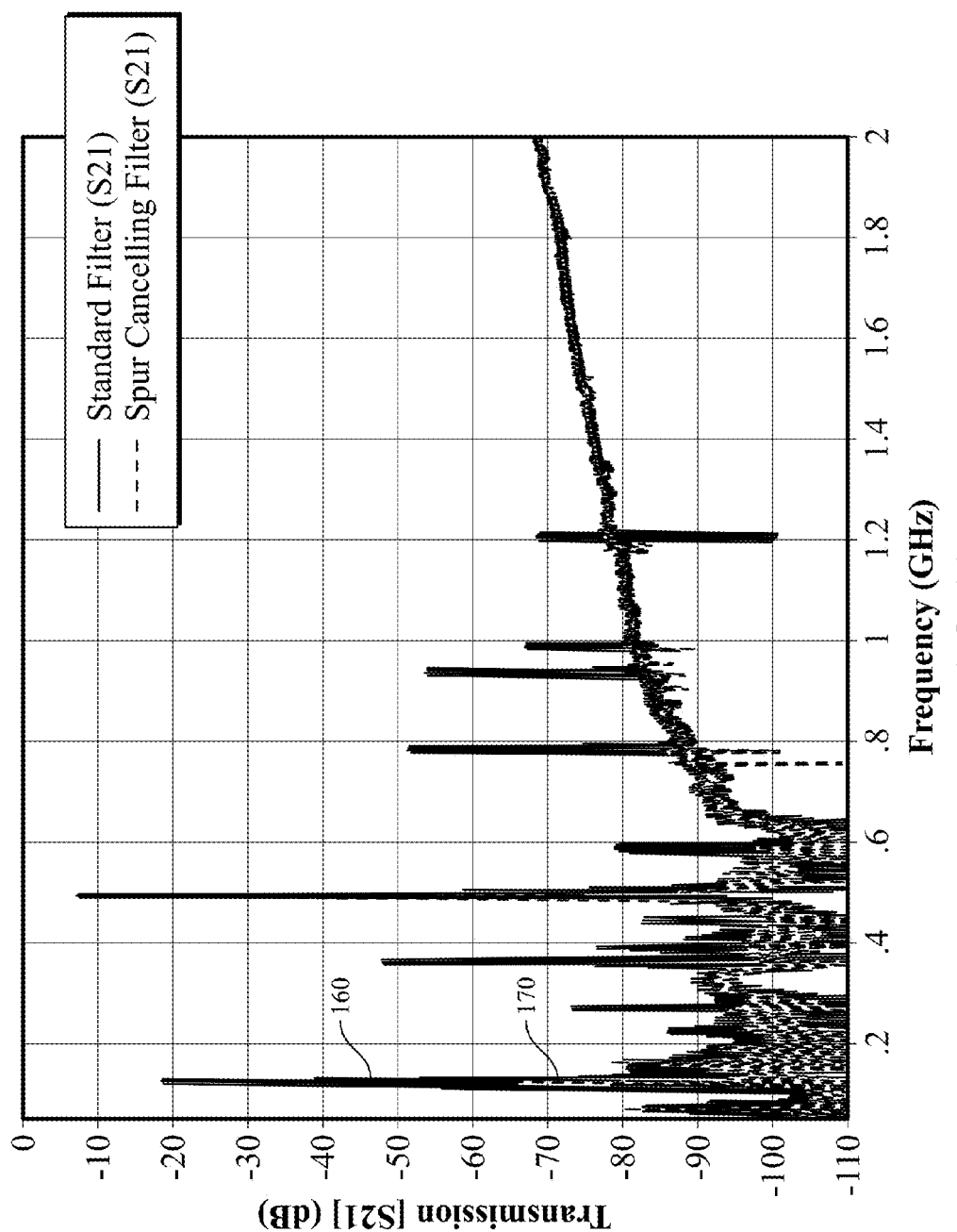
FIG. 14 is a plot, taken from FIGS. 12 and 13, of the experimentally measured transmission responses of exemplary conventional (160) and spur-cancelling (170) filters. As seen, the spur-cancelling filter significantly attenuated the spurious modes.

FIG. 14 shows the wideband measured transmission [S21] for both the standard filter design (curve 160) and the spur cancelling filter design (curve 170). The level of spurious rejection achieved by the spur cancelling filter can be clearly seen. The spur cancelling filter significantly attenuated the spurious modes, thereby enabling for the filter a minimum out-of-band rejection of 58.8 dBc from 50 MHz to 2000 MHz.

Figure 15:
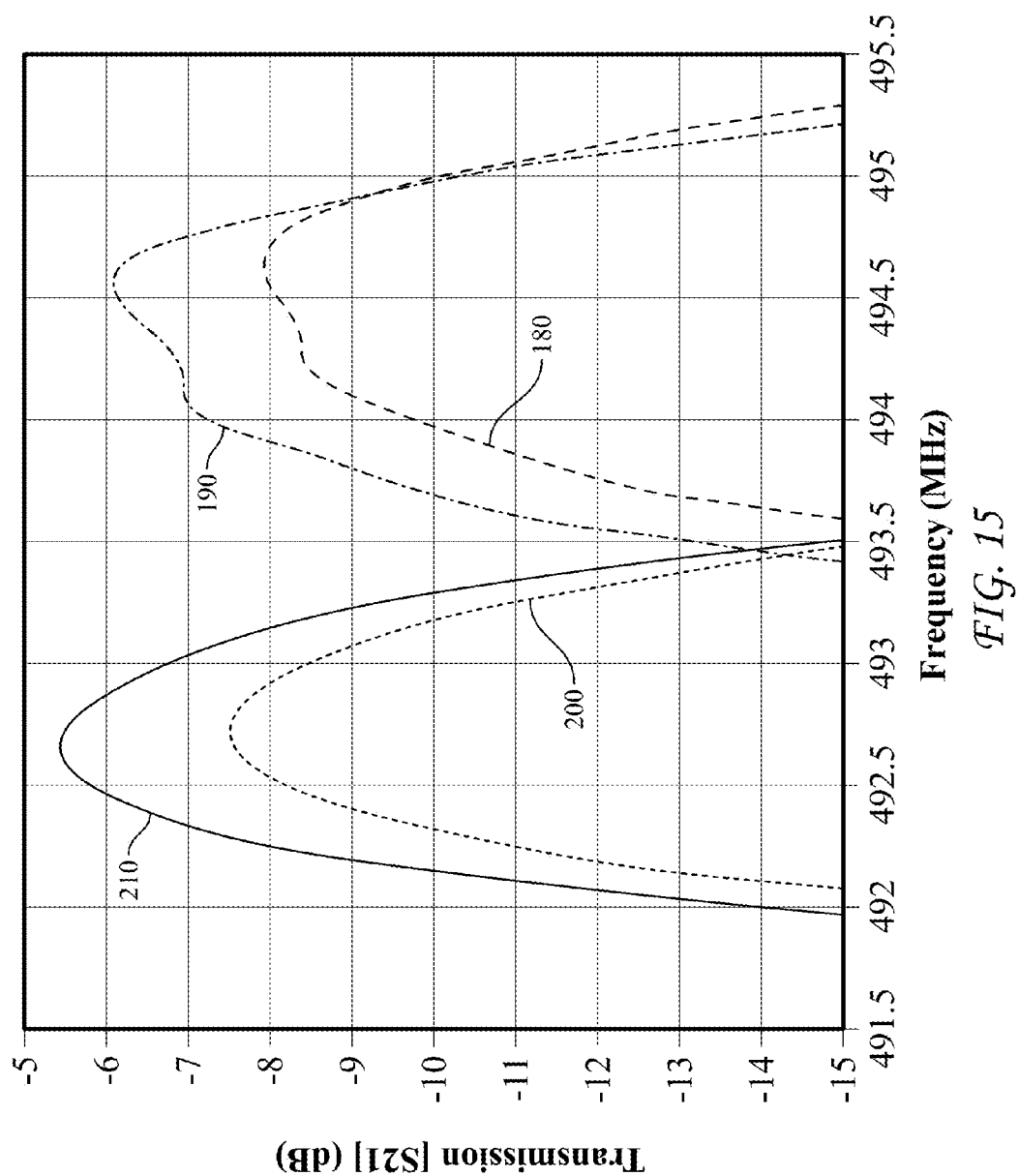
FIG. 15 is a plot of the experimentally measured responses of an exemplary conventional filter at −40° C. (180), the exemplary conventional filter at +120° C. (190), an exemplary spur-cancelling filter at −40° C. (200), and the exemplary spur-cancelling filter at +120° C. (210).

Shown in FIG. 15 is the measured narrow band transmission [S21] of both the standard and spur cancelling filters at −40° C. and +120° C. Curve 180 is the low-temperature response of the standard filter. Curve 190 is the high-temperature response of the standard filter. Curve 200 is the low-temperature response of the spur-cancelling filter. Curve 210 is the high-temperature response of the spur-cancelling filter. From these plots and additional measurements at −20, 0, 20, 40, 60, 80 and 100° C., a linear TCF of −1 ppm/° C. was calculated for each filter.

Over the 160° C. temperature variation in FIG. 15, the spur cancelling filter center frequency moved by 75 kHz, which is a small fraction of the 1 MHz filter 3 dB bandwidth. The improved insertion loss of the filters at higher temperatures was due to an increase in the resonator quality factor. Higher quality factor leads to improved insertion loss, particularly in narrow % bandwidth filters. The overall die area including pads of the filter was 0.7×3.15 mm². We demonstrated spur free, narrow % BW, thermally stable filters with steep roll off and a direct 50Ω termination in an ultra-miniature footprint.

To recapitulate, we developed a new approach for attenuating the spurious responses in electromechanical filters. In specific embodiments, we applied our approach to aluminum nitride, micromechanical, Lamb-wave filters. However, the applications of our approach are not so limited. Instead, they apply to, among other things, SAW and bulk acoustic wave-based filters and resonators and any other resonant devices that utilize the vibrations of a piezoelectric plate or membrane, as well as to non-piezoelectric electromechanical devices such as capacitively and optically transduced acoustic resonators.

Our approach can be applied to any of various filter architectures. One such category of filter architectures comprises ladder filters. Another such category of filter architectures comprises the lattice filters, such as a parallel lattice filter, a lattice filter with an inverting element, a Balun lattice filter, and a fully differential lattice filter. In a parallel lattice filter, for example, each resonator (rather than each filter pole) can be realized from a parallel combination of physically non-identical microresonators electrically connected in parallel to reduce the spurious response in each resonator itself.

As explained above, our approach for spur mitigation is to form filters from resonators with different physical implementations with near identical electrical responses in the filter passband, but with spurious responses occurring at different frequencies.

The spur mitigation approach was demonstrated in a 4-pole self-coupled filter at 493 MHz, where two of the filter poles were realized using 3-finger AlN micromechanical resonators with an overall width of 24 μm, while the other two poles were formed from 4-finger AlN micromechanical resonators with an overall width of 32 μm. The operating wavelength of 16 μm and all other resonator dimensions were identical.

The spur cancelling filter improved the attenuation of the largest filter spur by 47.5 dB, relative to a 4-pole filter realized using identical 4-finger resonators (standard approach) to form each filter pole. The spur cancelling filter had greater than 59.6 dBc of stop band and spurious response rejection over a bandwidth from 50 MHz to 2 GHz. The spur cancelling filter had a measured insertion loss of 6.2 dB, bandwidth of 1 MHz, and a 20 dB shape factor of 2.3.

Furthermore, the spur cancelling filter had a measured shift in center frequency of 75 kHz over a 160° C. temperature range, which is a small fraction of the 1 MHz bandwidth. Occupying a die area of only 0.7×3.15 mm², the AlN micromechanical filter is much smaller than competing technologies for similar narrow bandwidth, temperature compensated performance in the lower end of the ultrahigh (UHF) frequency band.

Whereas the invention has been described in connection with specific embodiments thereof, it will be understood that it is capable of further modifications and this application is intended to cover any variations, uses, or adaptations of the invention following, in general, the principles of the invention and including such departures from the present disclosure that come within known or customary practice within the art to which the invention pertains and may be applied to the essential features hereinbefore set forth, and follows in the scope of the claims.

Other embodiments are within the claims.

The invention claimed is:

1. A multiple-pole electromechanical filter having a center frequency F, comprising:
   a first electroacoustic resonator configured to have a first resonant frequency substantially equal to F and configured to vibrate in a first mode shape in response to excitation at the first resonant frequency; and
   electrically connected to the first electroacoustic resonator, a second electroacoustic resonator configured to have a second resonant frequency substantially equal to F and configured to vibrate in a second mode shape in response to excitation at the second resonant frequency;
   wherein:
   the first electroacoustic resonator at least partially constitutes a first pole of the multiple-pole electromechanical filter;
the second electroacoustic resonator at least partially constitutes a second pole of the multiple-pole electromechanical filter;
   the first and second electroacoustic resonators have different geometrical configurations;
   the first mode shape is different from the second mode shape;
   each said electroacoustic resonator comprises one sub-resonator or two or more electrically connected sub-resonators;
   the sub-resonators that constitute each electroacoustic resonator are connected to each other in parallel; and
   the first and second electroacoustic resonators are connected to each other in series.

2. A multiple-pole electromechanical filter having a center frequency F, comprising:
   a first electroacoustic resonator configured to have a first resonant frequency substantially equal to F and configured to vibrate in a first mode shape in response to excitation at the first resonant frequency; and
   electrically connected to the first electroacoustic resonator, a second electroacoustic resonator configured to have a second resonant frequency substantially equal to F and configured to vibrate in a second mode shape in response to excitation at the second resonant frequency;

wherein:
the first electroacoustic resonator at least partially constitutes a first pole of the multiple-pole electromechanical filter;
the second electroacoustic resonator at least partially constitutes a second pole of the multiple-pole electromechanical filter;
the first and second electroacoustic resonators have different geometrical configurations;
the first mode shape is different from the second mode shape;
each said electroacoustic resonator comprises one sub-resonator or two or more electrically connected sub-resonators;
the sub-resonators that constitute each electroacoustic resonator are connected to each other in series; and
the first and second electroacoustic resonators are connected to each other in parallel.

3. A multiple-pole electromechanical filter having a center frequency F, comprising:
a first electroacoustic resonator configured to have a first resonant frequency substantially equal to F and configured to vibrate in a first mode shape in response to excitation at the first resonant frequency; and
electrically connected to the first electroacoustic resonator, a second electroacoustic resonator configured to have a second resonant frequency substantially equal to F and configured to vibrate in a second mode shape in response to excitation at the second resonant frequency;
wherein:
the first electroacoustic resonator at least partially constitutes a first pole of the multiple-pole electromechanical filter;
the second electroacoustic resonator at least partially constitutes a second pole of the multiple-pole electromechanical filter;
the first and second electroacoustic resonators have different geometrical configurations;
the first mode shape is different from the second mode shape;
each said electroacoustic resonator comprises one sub-resonator or two or more electrically connected sub-resonators;
each sub-resonator comprised by the first electroacoustic resonator includes an integer number $n_1$ of one or more electrode fingers; and
each sub-resonator comprised by the second electroacoustic resonator includes an integer number $n_2$ of one or more electrode fingers; wherein $n_1$ is not equal to $n_2$.

4. The multiple-pole electromechanical filter of claim 3, wherein:
the first electroacoustic resonator comprises an integer number $m_1$ of sub-resonators, each of which has $n_1$ electrode fingers;
the second electroacoustic resonator comprises an integer number $m_2$ of microresonators, each of which has $n_2$ electrode fingers; and
the product $m_1 \times n_1$ is about the same as the product $m_2 \times n_2$.

5. The multiple-pole electromechanical filter of claim 4, wherein the first electroacoustic resonator comprises sub-resonators each having three electrode fingers, and the second electroacoustic resonator comprises sub-resonators each having four electrode fingers.

6. The multiple-pole electromechanical filter of claim 4, comprising at least one further electroacoustic resonator that comprises a plurality of sub-resonators having a total number of electrode fingers that is about the same as $m_1 \times n_1$ and about the same as $m_2 \times n_2$.

7. The multiple-pole electromechanical filter of claim 4, comprising at least two electroacoustic resonators that comprise pluralities of three-electrode-finger sub-resonators and at least two electroacoustic resonators that comprise pluralities of four-electrode-finger sub-resonators.

8. The multiple-pole electromechanical filter of claim 7, wherein the sub-resonators that constitute each said plurality of sub-resonators are connected to each other in parallel, and wherein the electroacoustic resonators are connected to each other in series.

9. The multiple-pole electromechanical filter of claim 3, wherein $n_1$ is at least two, $n_2$ is at least two, and the electrode fingers are interdigitated electrode fingers that alternate between input-signal-carrying fingers and output-signal-carrying fingers.

10. The multiple-pole electromechanical filter of claim 3, configured as a parallel lattice filter.

11. The multiple-pole electromechanical filter of claim 3, configured as a ladder filter.

12. The multiple-pole electromechanical filter of claim 3, wherein the sub-resonators are conformed as contour-mode resonators.

13. The multiple-pole electromechanical filter of claim 3, wherein the center frequency is in the range 400 MHz to 600 MHz.

14. The multiple-pole electromechanical filter of claim 3, wherein the sub-resonators are all 5-100 μm wide.

15. The multiple-pole electromechanical filter of claim 3, wherein a spurious response rejection greater than about 50 dBc is achieved over a bandwidth of 50 MHz to 2 GHz.

16. The multiple-pole electromechanical filter of claim 3, wherein the sub-resonators each comprise an aluminum nitride piezoelectric layer.

17. The multiple-pole electromechanical filter of claim 16, wherein the sub-resonators each comprise a temperature compensation layer that underlies the aluminum nitride layer.

* * * * *